United States Patent [19]
Park

[11] Patent Number: 4,924,702
[45] Date of Patent: May 15, 1990

[54] LIQUID LEVEL SENSOR

[75] Inventor: Kyong Park, Thousand Oaks, Calif.

[73] Assignee: Kavlico Corporation, Moorpark, Calif.

[21] Appl. No.: 321,892

[22] Filed: Mar. 10, 1989

[51] Int. Cl.[5] .................... G01F 23/26; G01R 27/26
[52] U.S. Cl. ..................... 73/304 C; 324/690; 361/284
[58] Field of Search .............. 73/304 C; 361/284; 324/61 P

[56] References Cited

U.S. PATENT DOCUMENTS

| | | | |
|---|---|---|---|
| 2,699,523 | 1/1955 | Meyers | 317/246 |
| 2,754,457 | 7/1956 | Meyers | 73/304 C X |
| 2,789,435 | 4/1957 | Weiss | 73/304 |
| 2,864,981 | 12/1958 | De Giers | 317/246 |
| 2,919,579 | 1/1960 | Gronner | 73/304 |
| 2,941,403 | 6/1960 | Steefeld et al. | 73/304 C |
| 2,943,258 | 6/1960 | Shawhan | 324/57 |
| 3,114,262 | 12/1963 | Atun | 73/304 |
| 3,192,455 | 6/1965 | Bergeson | 73/304 C X |
| 3,219,925 | 11/1965 | Borley et al. | 324/61 |
| 3,515,000 | 6/1970 | Baumoel | 73/304 |
| 3,533,286 | 10/1970 | Westcott et al. | 73/304 |
| 3,570,003 | 3/1971 | West | 317/246 |
| 4,208,909 | 6/1980 | Maltby et al. | 73/304 |
| 4,389,900 | 6/1983 | Gutierrez | 73/304 C |
| 4,528,839 | 7/1985 | Blanchard et al. | 73/1 H |
| 4,806,847 | 2/1989 | Atherton et al. | 324/61 P |

FOREIGN PATENT DOCUMENTS

| | | | |
|---|---|---|---|
| 9983 | 11/1956 | German Democratic Rep. | 361/294 |
| 57-34412 | 2/1982 | Japan | 73/304 C |
| 114980 | 9/1945 | Sweden | 73/304 C |
| 146521 | of 1962 | U.S.S.R. | 73/304 C |

*Primary Examiner*—Daniel M. Yasich
*Attorney, Agent, or Firm*—Poms, Smith, Lande & Rose

[57] ABSTRACT

A capacitive sensor is constructed to eliminate electrical conduction through a liquid being measured. The electrical conduction in the liquid occurs between the plates of the reference and measuring capacitors. The capacitive plates which are spaced from the common capacitive plate to form the reference and measuring capacitors are of unitary construction and formed from anodized aluminum. The anodization forms an insulated surface which prevents conduction between the electrodes through the liquid. A ratio taken between the measuring capacitor and reference capacitor is therefore indicative of the level of the liquid within the gap of the measuring capacitor and is independent of the conductance of the liquid and its dielectric constant. Such a probe is particularly useful in applications where the liquid undergoes indeterminable changes in conductivity such as a lubricant which becomes contaminated by metallic particulates.

22 Claims, 2 Drawing Sheets

LIQUID LEVEL SENSOR

BACKGROUND OF THE INVENTION

1. Field of the Invention

The present invention relates generally to liquid level sensors and more particularly to a capacitive liquid level sensor especially useful for measuring the level of the liquid which undergoes changes in conductivity.

2. Description of the Related Art

Capacitive probes and sensors for measuring the level of a liquid within a reservoir are well known. Such sensors generally include a reference capacitor adapted to be fully submerged in the liquid and a measuring capacitor. As the level of the liquid elevationally varies within the gap between the plates of the measuring capacitor, the capacitance changes due to the change of the dielectric constant between the plates. By taking the ratio of the capacitance between the two capacitors, the level of the liquid may then be ascertained. The ratio of the capacitances compensates for temperature dependency by cancelling of the temperature dependency in the value of capacitance for each capacitor.

A class of such capacitive sensor has been developed to measure the level of a conductive or lossy dielectric liquid, especially where the conductivity of the liquid is initially unkown and also varies during measurement. For example, where the liquid is a lubricant used in machinery, contamination in the form of metallic particulates suspended in the lubricant significantly and undeterminably affect the conductivity of the liquid. When the sensor is inserted in a conductive liquid, conductance between the plates of the reference and measuring capacitors causes errors in measuring the capacitive ratio whereby the sensor becomes inaccurate.

Attempts have been made to correct the above problems in capacitive sensors by providing phase discrimination between the resistive and capacitive voltages. The resistive voltage arises from the inaccuracies due to the conduction between the two capacitors. Since the resistive and capacitive voltages are 90° out of phase with each other, phase discrimination should be able to eliminate the resistive component. However, these prior art attempts have not met with a great degree of success. Phase discrimination permits a portion of the resistive voltage to add or subtract from the desired phase discriminated output current due to unavoidable circuit phase shifts. Since the resistive current may be generally very large, indicating a virtual short circuit between the two capacitors, the errors thus produced can be many times greater than the capacitance signal current. The results is that such a capacitive sensor system may be disadvantageously inaccurate.

In the prior art, this inaccuracy has been compensated for by the use of resistive bridge circuit wherein the parasitic conductance through the liquid forms a first resistor of a balancing bridge and a potentiometer is provided in another leg of the bridge to compensate, thereby removing the parasitic resistance from the capacitive ratio. However, the conductance of a liquid may be highly dependent upon temperature, causing the parasitic resistor to change value relative to the potentiometer setting.

Complex electromechanical systems have been proposed for the in situ adjustment of the potentiometer based upon means provided to sense the conductivity of the liquid, for example as described in U.S. Pat. No. 3,114,262. In the '262 patent, a feedback circuit from the output to the input of the bridge is discribed wherein the feedback signal is a function of the resistivity of the liquid to be measured. The feedback circuit is designed to have a negative resistance temperature coefficient. As described in column 2, lines 39-50 of the '262 patent, the feedback signal has a high effect at high temperatures and a low effect at low temperatures, such that amplifier gain is lowest at high temperatures and highest at low temperatures. The bridge operation is thus stabilized over a wide range of temperatures. A limitation of the described system is that the resistive bridge circuit and the feedback circuit must be accurately matched to the liquid being measured.

In U.S. Pat. No. 3,515,000 an attempt to overcome the above disadvantage of matching the bridge impedance and the resistivity of the liquid being measured is described. A sensor is provided wherein the measuring electrode and the common electrode are in the input circuit of an operational amplifier, the reference electrode and the common electrode are in the feedback circuit of the amplifier. The impedance in the input circuit between the measuring electrode and the common electrode will be a function of the level of the liquid in the tank in which the sensor is immersed. The feedback impedance will be a function of the characteristics of the same liquid since the reference electrode is immersed in the same liquid as the measuring electrode. The gain of the operational amplifier connected in this manner will be equal to the ratio of the reference impedance of the measuring impedance. Since both impedances are products of the electrical impedance of the same liquid, the ratio will be indepedent of the electrical impedance of the liquid and it will merely indicate the ratio of the surface areas of the measuring and reference capacitors, hence the capacitive ratio, immersed in the liquid. A limitation of the capacitive sensor described in the '000 patent is that conductance in the liquid may occur between the measuring and the reference electrodes as hereinabove discussed. If this conductance becomes large enough, the operational amplifier will be shorted out and hence always have unity gain independent of the level of the liquid to be measured.

SUMMARY OF THE INVENTION

It is a feature of the present invention to provide a capacitive sensor which is insensitive to temperature or dielectric changes due to contamination or aging of the liquid being measured.

According to the present invention, a capacitive sensor insertable into a reservoir containing a liquid wherein the liquid undegoes indeterminable variation in contamination and electrical conductivity during the measuring comprises three members. The first member is conductive and has a first face region and a second face region elevationally displaced from the first region. The second member is of unitary construction and has an electrically conductive portion and an electrically insulative portion. The insulative portion is in the facing relationship to the first face region of the first member to form a first gap of one capacitor. The third member also of unitary construction includes an electrically conductive portion and an electrically insulative portion, its insulative portion being in a facing relationship to the second face region of the first member to form a second gap and a second capacitor. The sensor is positioned within the reservoir wherein the liquid entirely fills the first gap, and the liquid elevationally varies in the second gap commensurately with the level of liquid in the reservoir. It is a feature of the present invention that the insulative portion of each of the second and third members electrically isolates each conductive portion thereof from the liquid and from electrical conduction through the liquid between the second and third members.

These and other objects, advantages and features of the present invention will become apparent to those skilled in the art from a study of the following description of the preferred embodiment of the invention and that in conjunction with the attached drawings and appended claims.

DESCRIPTION OF THE PREFERRED EMBODIMENT

Figure 1:
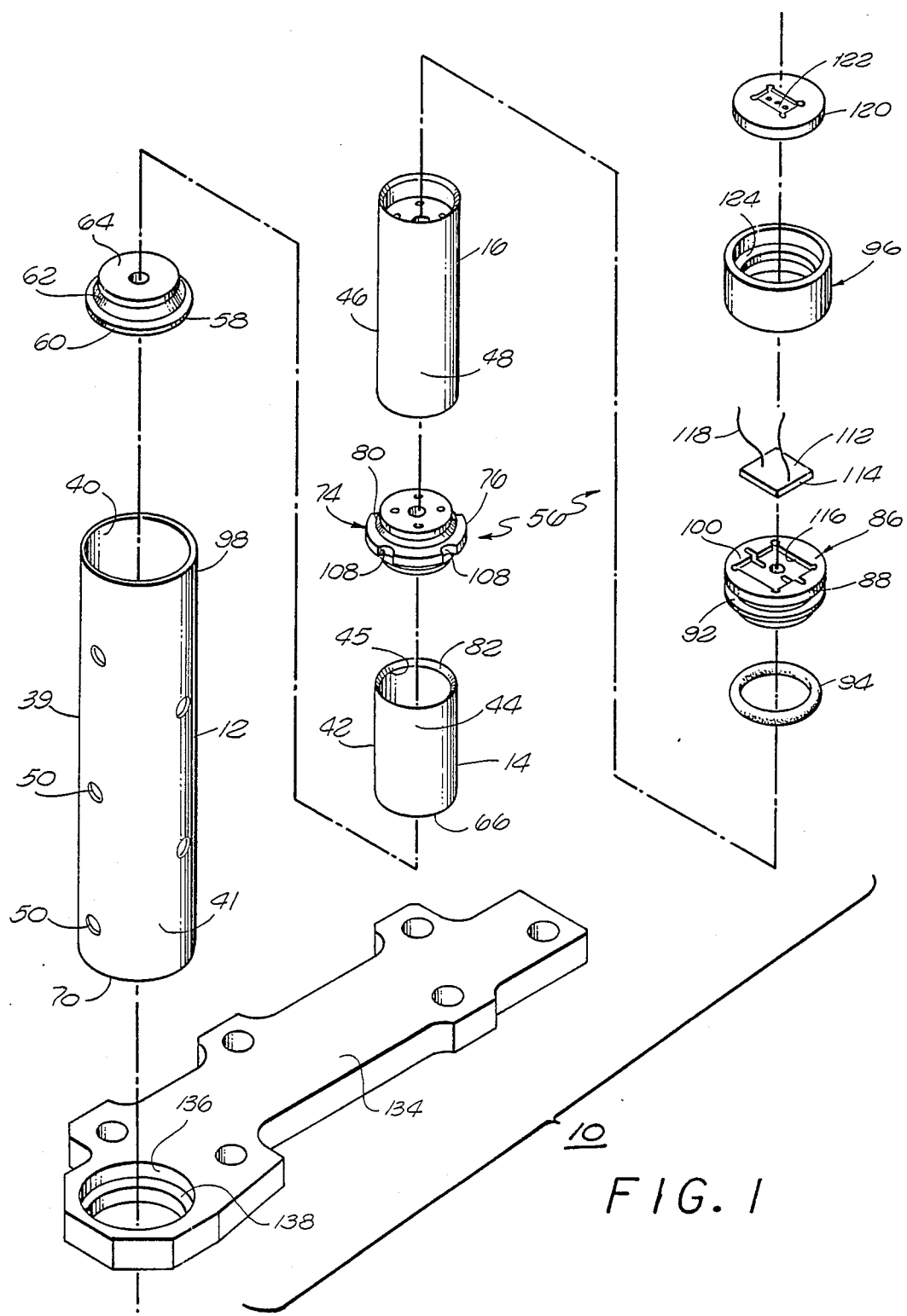
FIG. 1 is an exploded view of a capacitive sensor constructed according to the principles of the present invention.
Figure 2:
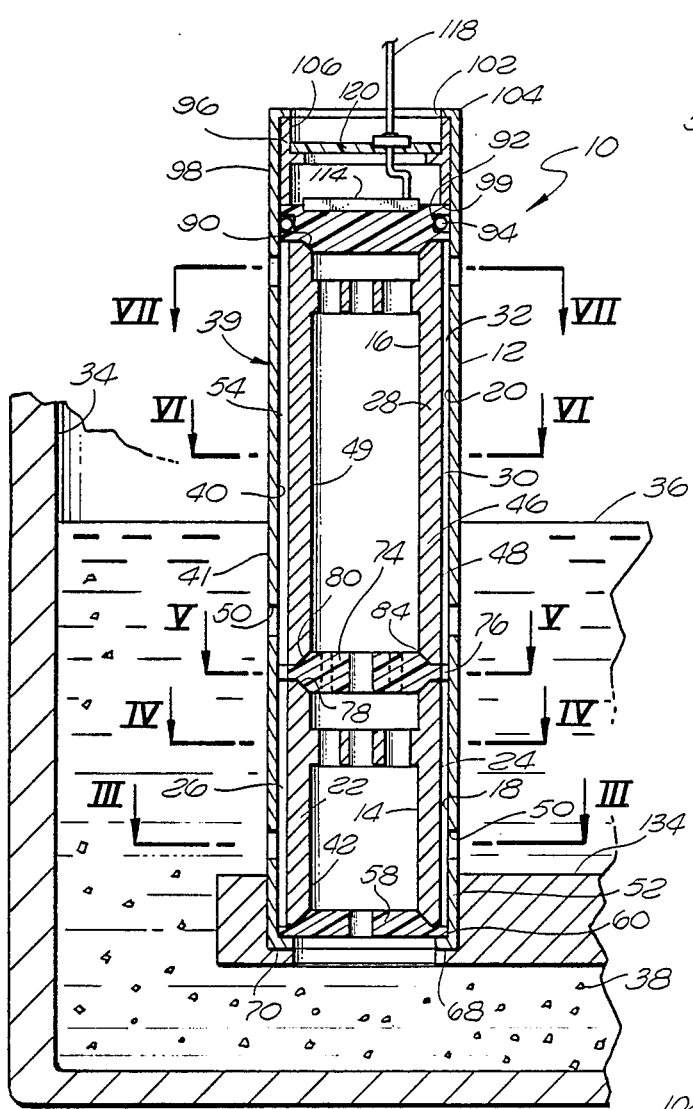
FIG. 2 is a cross-section of an assembled sensor of FIG. 1.

Referring now to FIGS. 1 and 2, there is shown a capacitive sensor 10 constructed according to the principles of the present invention. The sensor 10 includes a first conductive member 12, a second member 14 and a third member 16.

The first member 12 has a first face region 18 and a second face region 20. As best seen in FIG. 2, the second face region 20 is elevationally displaced from the first face region 18.

The second member 14 is of unitary construction and includes a conductive inner portion 22 and an insulative surface portion 24. The insulative portion 24 is disposed in a facing relationship to the first face region 18 of the first conductive electrode 12 to form a first gap 26.

Third member 16 is also of unitary construction and includes conductive inner portion 28 and an insulative surface portion 30. The insulative surface portion 30 of the third member 16 is disposed in a facing relationship to the second face region 20 of the first conductive member 12 to form a second gap 32.

The sensor 10, as best seen in FIG. 2, is adapted for positioning within a reservoir 34 wherein a liquid 36 entirely fills the first gap 26 and elevationally varies in the second gap 32 commensurately with the level of the liquid 36 in the reservoir 34. The insulative surface portions 24, 30 of each of the second member 14 and the third member 16 electrically isolates each of their respective conductive inner portions 22, 28 from electrical conductance through the liquid 36. For example the liquid 36 such as lubricating oil within machinery or hydraulic fluid within a transmission may become contaminated with metal particulates 38. These particulates 38 may then precipitate out and deposit on the second member 14 and third member 16, and even clog the first gap 26 and second gap 32. In the prior art, this precipitation would cause increased conductance to the liquid, eventually shorting out the electrodes in the prior art sensor, although any conductance may cause inaccuracies in the operation of the prior art probe. According to the present invention, the insulative surface portions 24, 28 prevent any conductance or short circuit between the second member 14 and the third member 16 through the liquid 36.

In one embodiment of the present invention, the first member 12 is constructed from an elongated first tube 39 which has an inner surface 40 and an outer surface 41. Each of the first and second face regions 18, 20 extends axially along the inner surface 40 and has a predetermined height. The first tube 39 may be constructed from any suitable electrically conductive material such as aluminum.

The second member 14 is constructed from an elongated second tube 42 axially dimensioned commensurately with the predetermined height of the first face region 18. The second tube 42 is coaxially disposed within the first tube 39. The insulative surface portion 24 of the second electrode 14 is formed an outer surface 44 of the second tube 42. An inner surface 45 of the second tube 42 is also insulative. For example, the second tube 42 may be constructed from a conductive material which is then oxidized to form the insulative surface portion 24.

The third member 16 is constructed from an elongated third tube 46 axially dimensioned commensurately with the predetermined height of the second face region 20. The third tube 46 is coaxially disposed within the first tube 39. The insulative surface portion 30 of the third member 16 is formed on an outer surface 48 of the third tube 46. An inner surface 49 of the third tube 46 is also insulative. The third tube 46 may also be constructed from a conductive material which is then oxidized to form the insulative surfaces. For example, the second tube 42 and third tube 46 may each be formed from black anodized aluminum.

Figure 3:
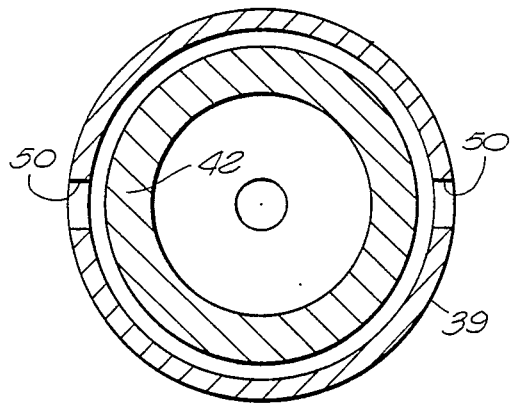
FIG. 3 is a cross-section of the sensor of FIG. 2 taken along line III—III.
Figure 6:
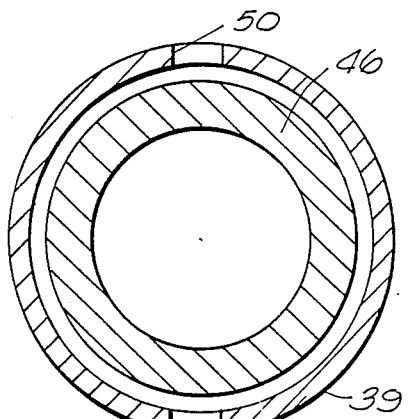
FIG. 6 is a cross-section of the sensor of FIG. 2 taken along line VI—VI.

As best seen in FIG. 1, FIG. 3 and FIG. 6, the first tube 39 has a plurality of openings 50 extending between its inner surface 40 and outer surface 41. Some of the openings 50 communicate the first gap 26 externally of the first tube 39 (FIG. 3) and the remaining openings 50 communicating the second gap 32 externally of the first tube 39 (FIG. 6). Apparent from the above description of the sensor 10 is that the first tube 39 and the second tube 42 form the plates of a first capacitor 52 which includes the first gap 26. Similarly, the first tube 39 and the third tube 46 form the plates of a second capacitor 54 which includes the second gap 32. The plates of the first capacitor 52 and the second capacitor 54 may be formed from the first member 12, second member 14, and the third member 16, wherein such members may be of any suitable size and shape to form the first capacitor 52 and second capacitor 54. In one embodiment of the pesent invention, each of the first gap 26 and the second gap 32 is 0.14 inches (0.36 centimeters).

The sensor 10 further includes means 56 for mounting the second tube 42 and the third tube 46 coaxially within the first tube 39. The mounting means 56 includes a first spacer 58. The spacer 58 has a circumferential portion 60 in sliding engagement with the inner surface 40 of the first tube 39 and a frustoconical section 62 extending from a top surface 64 of the first spacer 48. The frustoconical section 62 is dimensioned to about a lower edge portion 66 of the second tube 42. Accordingly, the lower edge portion 66 of the second tube 42 may be inwardly bevelled to receive the frustoconical section 62. First tube 39 includes first annular flange 68 extending inwardly from it, inner surface 40 at a lower edge portion 70 of the first tube 39. A lower surface 72 of the first spacer 58 is seated on the flange 68.

Mounting means 56 further includes a second spacer 74 disposed between the second tube 42 and the third tube 46. The second spacer 74 has a circumferential edge portion 76 in sliding engagement with the inner surface 40 of the first tube 39 and a lower frustoconical surface 78 and an upper frustoconical surface 80. The lower frustoconical surface 78 is dimensioned to abut an upper edge portion 82 of the second tube 42. The upper edge portion 82 of the second tube 42 may also be inwardly bevelled. The upper frustoconical surface 80 is dimensioned to abut with a lower edge portion 84 of the third tube 46 which may also be inwardly bevelled.

Mounting means 56 further includes a third spacer 86 having a circumferential edge 68 in sliding engagement with inner surface 40 of the first tube 39 and a lower frustoconical surface 90. The lower frustoconical surface 90 of the third spacer 88 is dimensioned to abut an upper edge portion 92 of the third tube 46, which may also be inwardly bevelled.

The third spacer 86 further includes a channel 92 disposed in the circumferential edge 88. Mounting means 46 further includes an O-ring 94 pressingly engaged between the inner surface 40 of the first tube 39 and the third spacer 86 within the channel 92.

Mounting means 56 further includes an end cap 96 dimensioned to be slidingly engaged with the inner surface 40 in an upper end portion 98 of the first tube 39. A lower edge 99 of the end 96 cap abuts an upper surface 100 of the third spacer 86. The first tube 39 further includes a second annular flange 102 extending inwardly from its inner surface 40 at an upper edge portion 104 of the first tube 39. The second annular flange 102 exerts an axially inward force on an upper edge 106 of the end cap 96 to pressingly mount the second tube 42 and the third tube 46 against the first spacer 58, the second spacer 74 and the third spacer 86. The first flange 68 and second flange 102 may be formed by crimping each edge portion of the first tube 39 to exert counter-compression forces to mount the second tube 42, and the third tube 46 as described immediately hereinabove.

Figure 5:
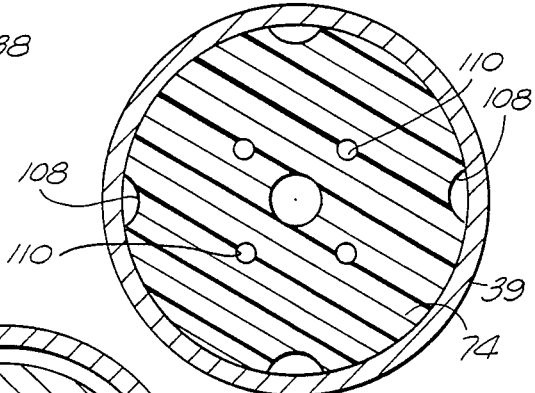
FIG. 5 is a cross-sectional view of the sensor of FIG. 2 taken along line V—V.

Referring now to FIG. 5, the second spacer 74 includes a plurality of arcuate openings 108 disposed at the circumferential edge thereof. The arcuate openings 108 communicate the first gap 26 with the second gap 32. The second spacer 74 also includes a plurality of openings 110 to allow the liquid 36 to drain from the interior of the sensor 10.

In an alternative embodiment of the present invention, each of the first, second and third spacers 58, 74 and 86 includes a coaxial bore therethrough. Mounting means 46 may further include an elongated bolt (not shown) having a flattened head portion and a rod portion. The rod portion is received through each of the coaxial bores of the first spacer 48 and the second spacer 56. Furthermore, the rod has a threaded portion threadingly engaging the bore of the third spacer. The head portion then engages the annular flange 68 of the first tube 39.

The sensor 10 further include electronic circuit means 112 for determining the capacitive ratio between the first capacitor 52 and the second capacitor 54 and for developing a signal proportional to the ratio. Circuit means 112 may include an integrated circuit chip 114 mounted on the upper surface 100 of the third spacer 86. The third spacer 86 may include a recess 116 dimensioned to receive the chip 114. The capacitive ratio may, for example, be obtained as a ratio of the difference between the first and second capacitance to the sum of the first and second capacitance.

The sensor 10 may further include conduction means 118 operatively connecting the chip 114 to each of the first tube 39, the second tube 42 and the third tube 46. A feed through plate 120 has openings 122 for electrical wiring to extend from the chip 114 externally of the probe 10. The feed through plate 120 is mounted on any annular flange 124 within the end cap 96. To further protect the circuit chip 114, potting (not shown) fills the space between the third spacer 86 and the feed through plate 120.

Figure 4:
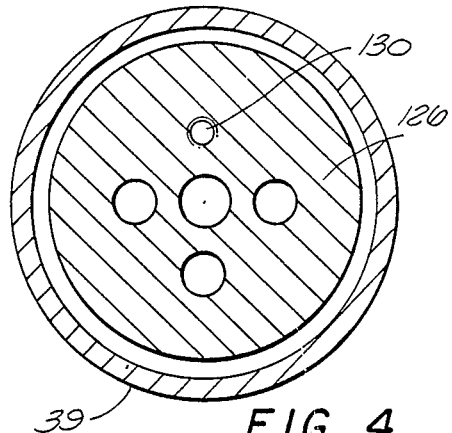
FIG. 4 is a cross-section of the sensor of FIG. 2 taken along line IV—IV.
Figure 7:
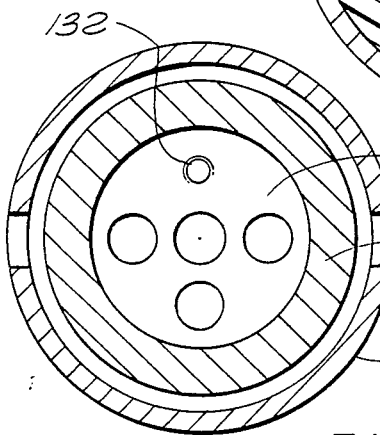
FIG. 7 is a cross-section of the sensor of FIG. 2 taken along line VII—VII.

Conduction means 118 further includes a first disc shaped member 126 formed unitarily with second tube 42 and a second disc shaped member 128 formed unitarily with third tube 46. As best seen in FIG. 4 and FIG. 7, first disc member 126 includes a tapped bore 130 and second disc member 128 includes a tapped bore 132. The tapped bores 130, 132 are formed after oxidation of the second tube 42 and the third tube 46 to electrically contact the respective conductive inner portions 22, 28 of the second and third tubes 42, 46, by conduction means 118.

A mounting bracket 134 may be provided with a bore 136 to receive sensor 10 in slidable engagement therein. The annular flange 68 abuts an annular lip 138 within the bore 136. The bracket 134 is designed to mount the sensor 10 at a suitable location within the reservoir 34 so that the first gap 26 is entirely filled with the liquid 36 and the level of the liquid 36 and the second gap 32 elevationally varies commensurately with the level of the liquid 36 within the reservoir 34.

There has been hereinabove described preferred embodiments of a capacitive sensor constructed according to the principles of the present invention. Those skilled in the art may now make numerous uses of and modifications to the above-described embodiments of the present invention without departing from the inventive concepts described herein. Accordinglly, the present invention is to be defined solely by the scope of the appended claims:

What is claimed is:

1. A capacitive sensor insertable into a reservoir containing a liquid wherein said liquid undergoes indeterminable variation in contamination and electrical conductivity, said sensor comprising:

a first electrically conductive member having a first face region and a second face region elevationally displaced from said first region;

a second member of unitary construction including an electrically conductive portion and an electrically insulative portion to isolate electrically said conductive portion from said liquid when said sensor is immersed therein, said second member being in a facting relationship to said first face region to form a first capacitor having a first gap communicating externally of said sensor; and a third member of unitary construction including an electrically conductive portion and an electrically insulative portion to isolate electricaly said conductive portion of said third member from said liquid when said sensor is immersed therein, said third member being in a facing relationship to said second face region to form a second capacitor having a second gap communicating externally of said sensor;

said sensor being adapted for positioning within said reservoir wherein said liquid entirely fills said first gap and said liquid elevationally varies in said second gap commensurately with said level of said liquid in said reservoir thereby varying capacitance of said second capacitor, such that said level of said liquid in said reservoir may be determined as a function of capacitance of said first capacitor and said second capacitor, said insulative portion of each of said second member and said third member electrically isolating said conductive portion of each of said second member and said third member from electrical conduction through said liquid between said second member and said third member.

2. A sensor as set forth in claim 1 wherein said first member includes an elongated first tube having an inner surface, each said face region being disposed on said inner surface.

3. A sensor as set forth in claim 2 wherein each said face region extends axially along said inner surface and has a predetermined height.

4. A sensor as set forth in claim 2 wherein said second member includes an elongated tube axially dimensioned commensurately with said predetermined height of said first face region and coaxially disposed within said first tube, said insulative portion of said second member being an outer surface of said second tube.

5. A sensor as set forth in claim 4 wherein said first tube has at least one opening communicating said first gap externally of said tube.

6. A sensor as set forth in claim 2 wherein said third member includes a third elongated tube axially dimensioned commensurately with said predetermined height of said second face region and coaxially disposed within said first tube, said insulative portion of said third member being an outer surface of said third tube.

7. A sensor as set forth in claim 6 wherein said first tube has at least one opening communicating said second gap externally of said first tube.

8. A capacitive prode sensor comprising:
an electrically conductive first tube having an inner surface, an outer surface, a first axially extending face region, a second axially extending face region, and a plurality of openings extending between said inner surface and said outer surface, each of said first face region and said second face region being disposed on said inner surface;
a second tube having an insulative outer portion and a conductive inner portion, said second tube being coaxially disposed within said first tube in a facing relationship to first face region, said first face region and said second tube forming a first capacitor having a first gap;
a third tube having an insulative outer portion and a conductive inner portion, said third tube being coaxially disposed within said first tube in a facing relationship to said second face region, said second face region and said third tube forming a second capacitor having a second gap;
means for mounting said second tube and said third tube within said first tube, said openings communicating said first gap and said second gap externally of said first tube; and means for electrically contacting said first tube and said conductive inner portion of each said of said second tube and said third tube to electrically determine a vaue of capacitance to each of said first capacitor and said second capacitor.

9. A sensor as set forth in claim 8 wherein said mounting means includes:
a first elastomeric spacer having a circumferential edge engaged with said inner surface of said first tube at a first end portion thereof and a frustoconical section extending from one surface of said first spacer and dimensioned to abut one end portion of said second tube;
a second elastomeric spacer disposed between said second tube and said third tube, said second spacer having a circumferential edge engaged with said inner surface of said first tube and a pair of frustoconical surfaces, each of said pair of frustoconical surfaces abutting adjacent end portions of said second tube and said third tube; and
a third elastomeric spacer having a circumferential edge engaged with said inner surface of said first tube at a second end portion thereof and a frustoconical surface engaging one end portion of said third tube.

10. A sensor as set forth in claim 9 wherein said third spacer has an annular channel in said circumferential edge, said mounting means further including an O-ring pressingly engaged between said inner surface of said first tube and said third spacer within said channel.

11. A sensor as set forth in claim 10 wherein said sensor further includes electronic circuit means for determining a ratio of capacitance between said first capacitor and said second capacitor to developing a signal proportional to said ratio.

12. A sensor as set forth in claim 11 wherein said electronic circuit means includes an integrated circuit chip mounted on an upper surface of said third spacer, said third spacer including a recess dimensioned to receive said chip, said conduction means operatively connecting said chip to each of said first tube, said second tube and said third tube.

13. A sensor as set forth in claim 12 wherein said mounting means further includes an end cap dimensioned for being slidingly fitted in said second end portion of said first tube, said end cap abutting said upper surface of said third spacer.

14. A sensor as set forth in claim 13 wherein said end cap includes an interior annular flange, said mounting means further including a feed through plate mounted on said flange, said feed through plate having an opening through which electrical wiring may extend from said chip externally of said sensor.

15. A sensor as set forth in claim 14 wherein said first tube has a first crimped edge portion and a second crimped edge portion, said first crimped edge portion exerting a compressive force on said first spacer, said second crimped edge portion exerting a counter compressive force on said end cap.

16. A sensor as set forth in claim 15 wherein said sensor further includes potting received in said second end portion of said first tube above said feed through plate.

17. A sensor as set forth in claim 9 wherein each end portion of said second tube and said third tube has a bevelled edge dimensioned for engagement with said frustoconical surface of each side spacer adjacent thereto.

18. A sensor as set forth in claim 9 wherein said second spacer includes a plurality of semi-circular openings disposed at said circumferential edge thereof, said semi-circular openings communicating said first gap with said second gap.

19. A sensor as set forth in claim 9 wherein said first spacer and said second spacer each include a plurality of openings to allow liquid to be communicated there through.

20. A sensor as set forth in claim 9 wherein each of said second tube and said third tube have an interior disc shaped member formed unitarily therewith, each of said member including a tapped bore to electrically contact said inner conductive portion of each said tube.

21. A sensor as set forth in claim 9 wherein each said spacer includes a coaxial bore therethrough, said mounting means further comprising an elongated bolt having a flattened head portion engaging said lower end portion of said first tube and a rod portion, said rod portion being received through said coaxial bores of said first spacer and said second spacer and threadingly engaging said bore of said third spacer.

22. A sensor as set forth in claim 8 wherein each said gap is 0.14 inches (0.36 cm.).

* * * * *